United States Patent
Smith et al.

(10) Patent No.: US 7,178,048 B2
(45) Date of Patent: Feb. 13, 2007

(54) SYSTEM AND METHOD FOR SIGNAL SYNCHRONIZATION BASED ON PLURAL CLOCK SIGNALS

(75) Inventors: Victoria Lo-Ren Smith, Los Angeles, CA (US); Theodore Briggs, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 396 days.

(21) Appl. No.: 10/744,174

(22) Filed: Dec. 23, 2003

(65) Prior Publication Data

US 2005/0138458 A1    Jun. 23, 2005

(51) Int. Cl.
*G06F 1/04* (2006.01)
(52) U.S. Cl. .................. 713/600; 713/400
(58) Field of Classification Search .......... 713/400, 713/500, 600
See application file for complete search history.

(56) References Cited

U.S. PATENT DOCUMENTS

| | | | |
|---|---|---|---|
| 6,172,937 B1 | 1/2001 | Ilkbahar et al. | |
| 6,292,116 B1 | 9/2001 | Wang et al. | |
| 6,292,521 B1 * | 9/2001 | Lai et al. | 375/357 |
| 6,311,285 B1 * | 10/2001 | Rodriguez et al. | 713/401 |
| 6,316,980 B1 | 11/2001 | Vogt et al. | |
| 6,317,369 B1 * | 11/2001 | Kubo et al. | 365/193 |
| 6,401,213 B1 * | 6/2002 | Jeddeloh | 713/401 |
| 6,449,213 B1 * | 9/2002 | Dodd et al. | 365/233 |
| 6,557,071 B2 * | 4/2003 | Stolt et al. | 711/105 |
| 6,573,761 B1 * | 6/2003 | MacDonald et al. | 327/91 |
| 6,581,017 B2 | 6/2003 | Zumkehr | |
| 6,603,706 B1 | 8/2003 | Nystuen et al. | |
| 6,609,171 B1 * | 8/2003 | Singh et al. | 710/305 |
| 6,621,760 B1 | 9/2003 | Ahmad et al. | |
| 6,625,702 B2 | 9/2003 | Rentschler et al. | |
| 6,629,225 B2 | 9/2003 | Zumkehr | |
| 6,650,101 B2 * | 11/2003 | MacDonald et al. | 324/76.24 |
| 6,807,613 B1 * | 10/2004 | Keeth et al. | 711/167 |
| 6,952,790 B2 * | 10/2005 | Ramanathan et al. | 713/401 |
| 6,978,402 B2 * | 12/2005 | Hirabayashi | 714/42 |
| 2002/0147892 A1 | 10/2002 | Rentschler et al. | |
| 2002/0149967 A1 | 10/2002 | Borkenhagen et al. | |
| 2003/0154416 A1 | 8/2003 | LaBerge | |
| 2004/0124893 A1 * | 7/2004 | Falconer et al. | 327/141 |

FOREIGN PATENT DOCUMENTS

WO    WO 01/48621 A1    7/2001

OTHER PUBLICATIONS

Macri, Joe, "DDR II—The Evolution Continues JEDEC Future Dram Task Group", JEDEC JC-42 Memory Committee, Apr. 1998.
"JEDEC Standard DDR2 SDRAM Specification JESD79-2", JEDEC Solid State Technology Association, Sep. 2003, pp. 1-71.
"PCI-X 2.0 Interface Transceiver Featuring Xoom (trademark)", LSI Logic Corporation, pp. 1-4, 2003.

* cited by examiner

*Primary Examiner*—Chun Cao

(57) ABSTRACT

A system includes a data path that provides a data signal at a first frequency corresponding to a first clock signal. A strobe generator generates a strobe signal at the first frequency. The strobe signal is synchronized with the data signal based on a second clock signal having a second frequency that is different from the first frequency.

35 Claims, 4 Drawing Sheets

SYSTEM AND METHOD FOR SIGNAL SYNCHRONIZATION BASED ON PLURAL CLOCK SIGNALS

BACKGROUND

Certain types of data transfer techniques employ a source-synchronous clocking protocol to transfer data from a data source to a destination for such data. A common example is a data transfer between a memory controller and associated memory, such as for performing a read or write operation.

In a typical source synchronous clocking protocol, a strobe signal is associated with data to facilitate data transfer. The strobe signal may be delayed relative to the data signal to mitigate errors associated with reading and/or writing data. The delay is typically implemented using a trace delay along the signal path or by employing an on-chip delay element. Variations in the delay between the strobe signal and the data signal may result in timing uncertainty as well as reduced performance.

SUMMARY

One embodiment of the present invention may comprise a system that includes a data path that provides a data signal at a first frequency corresponding to a first clock signal. A strobe generator generates a strobe signal at the first frequency, the strobe signal being synchronized with the data signal based on a second clock signal having a second frequency that is different from the first frequency.

A another embodiment of the present invention may comprise a system includes a synchronization component that provides a synchronization signal by propagating a first clock signal to define the synchronization signal based on a second clock signal. The second clock signal has a different frequency from a frequency of the first clock signal. A data path provides a data signal at the frequency of the first clock signal. A strobe generator generates a strobe signal synchronized with the data signal based on the synchronization signal and the second clock signal.

Yet another embodiment of the present invention may comprise a method that includes providing a first signal based on input data, the first signal having a desired frequency corresponding to a first clock signal. The method also can include providing a second signal that is synchronized with the first signal by employing a second clock signal having a frequency that is a multiple of the desired frequency.

DETAILED DESCRIPTION

This disclosure relates generally to synchronizing a strobe signal with a data signal, such as for use in source synchronous timing. First and second clock signals are employed to propagate data through a data path and to generate a corresponding strobe signal. The first and second clock signals are at different frequencies that facilitate implementing a desired phase shift between the strobe and the data signals. This approach helps to ensure proper synchronization between the first and second signals by mitigating uncertainty associated with signal paths. As a result, PVT (process, voltage, temperature) variations, crosstalk, clock jitter can be reduced relative to many existing approaches. Additionally, the approach described herein enables a design to be implemented with reduced hardware resources, which can further improve timing certainty in signal timing.

Figure 1:
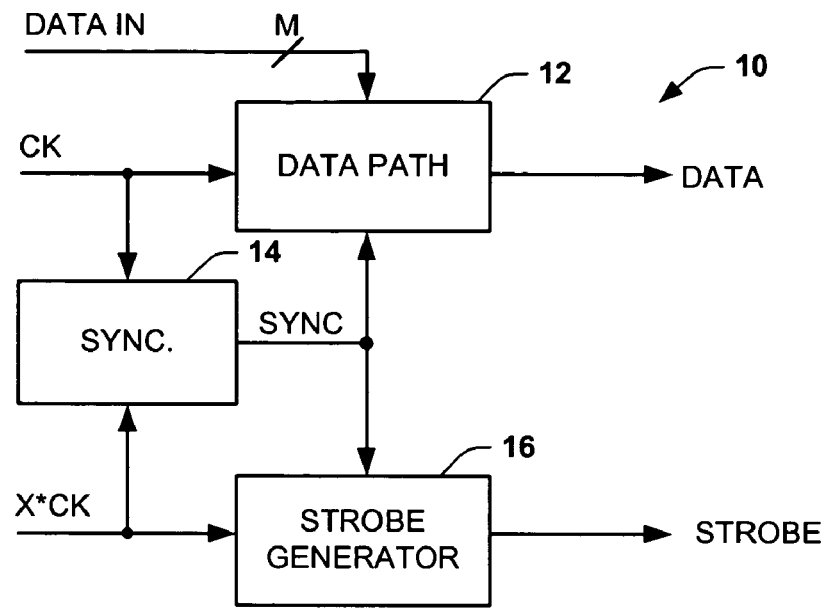
FIG. 1 depicts a simplified block diagram for implementing a timing strategy.

FIG. 1 depicts an example of a system 10 that is operative to provide a DATA signal synchronously with a corresponding STROBE signal. The system 10 can be implemented as part of a memory controller, such as an integrated memory and input/output controller. For example, the system 10 may be employed by a computer system to transmit input data (DATA IN) synchronously with the STROBE signal, such as for reading or writing the DATA signal to associated memory via a memory bus (not shown).

The system 10 includes a data path 12 for propagating the input data (DATA IN) to a desired destination. The data path 12 can comprise one or more components, such as logic elements or other circuitry, configured to propagate the input data (DATA IN) as a corresponding output DATA signal. The data path 12 provides the DATA signal at a desired frequency based on a clock (CK) signal. The CK signal, for example, can be a core clock signal associated with an integrated circuit (IC) chip implementing the system 10.

The input data (DATA IN) can be provided by any data source (not shown) as one or more (M) bits of data, where M is a positive integer (M≧1). Examples of possible input data sources include a central processing unit (CPU) or other processor coupled to the system 10 via a system bus (not shown). Input data (DATA IN) from a processor can be propagated through the data path 12 for writing the DATA to associated memory. Alternatively, the system 10 can be employed to read (or fetch) the DATA from one or more memory modules, such as in response to an appropriate instruction to read such data. For purposes of simplicity of explanation, this disclosure generally describes implementing write operations, although the approach is applicable to any source synchronous timing strategy. It is to be appreciated that the direction of the DATA through the data path 12 will generally depend on whether the system 10 is being implemented to read or write the DATA to a memory (not shown).

A synchronization block 14 also receives the CK signal and another clock signal, indicated at X*CK, where X denotes a frequency multiplier (e.g., X>1) identifying the relationship between frequencies of the clock signals. The clock signals CK and X*CK can be provided as having proportional frequencies (e.g., integer multiples of each other) with little or no clock skew. The synchronization block 14 provides a synchronization (SYNC) signal based on the pair of clock signals CK and X*CK. The synchronization block 14 provides the SYNC signal to the data path 12. The synchronization block 14 can provide the SYNC signal at the frequency of the CK signal and phase shifted (or delayed) a desired amount relative to the CK signal. For example, the SYNC signal may be phase shifted a desired amount by propagating the SYNC signal based on the X*CK signal. The particular amount of phase shift between SYNC and CK can vary according to the relative frequencies of the CK and X*CK signals as well as the particular logic utilized to implement the synchronization block 14.

The system 10 also includes a strobe generator 16 that provides the STROBE signal based on the SYNC and X*CK signals. The strobe generator 16 can provide the STROBE signal at substantially the same frequency as the DATA signal. Additionally, the X*CK signal enables the strobe generator 16 to implement the STROBE signal with a desired amount of phase shift relative to the DATA signal provided by the data path 12. The amount of phase shift can vary based on the relative frequencies between the CK and X*CK signals, their duty cycles, and the configuration of the system 10. For example, by selecting the frequency and duty cycle of the X*CK signal appropriately, different edges of the X*CK signal can be employed to implement a stable and fixed amount of phase delay between the DATA and STROBE signals. For example, the synchronization block 14 can employ a rising or falling edge of the X*CK signal to provide the SYNC signal, and the strobe generator 16 can employ a different respective clock edge of the X*CK signal to propagate the SYNC signal for driving the STROBE signal synchronously with the DATA signal.

By way of example, the system 10 can be utilized for writing a multi-bit (e.g., two bit) input signal (DATA IN) to associated memory (not shown). The memory can include one or more dynamic random access memory (DRAM) modules (e.g., double data rate (DDR) synchronous DRAM). The JEDEC Solid State Technology Association (once known as the Joint Electron Device Engineering Council) is the semiconductor engineering standardization body of the Electronic Industries Alliance that provides various standards for implementing different types of memory architectures, including the DDR and DDR II specifications. It is to be understood that the system 10 can be utilized for transmitting data synchronously with a strobe signal to satisfy any of the JEDEC specifications (e.g., JESD79-2 for DDR II) as well as other specifications. For the DDR II specification, the X*CK signal may be provided at twice the frequency of CK (i.e., X=2). This enables a desired quarter cycle phase shift between the STROBE signal and the DATA signal. It is to be appreciated that other amounts of phase shift (e.g., other fractional parts of a cycle or period) between the STROBE and DATA signals can be implemented.

Additionally, the CK and X*CK signals can be provided by a clock generator based on a reference clock signal. By employing a single clock generator (e.g., a PLL or delay locked loop (DLLs)) to provide both the CK and X*CK signals, clock skew can be mitigated. By mitigating clock skew between the respective clock signals (CK and X*CK), the system 10 can provide a desired timing relationship between the DATA and STROBE signals that exhibits improved timing certainty.

Figure 2:
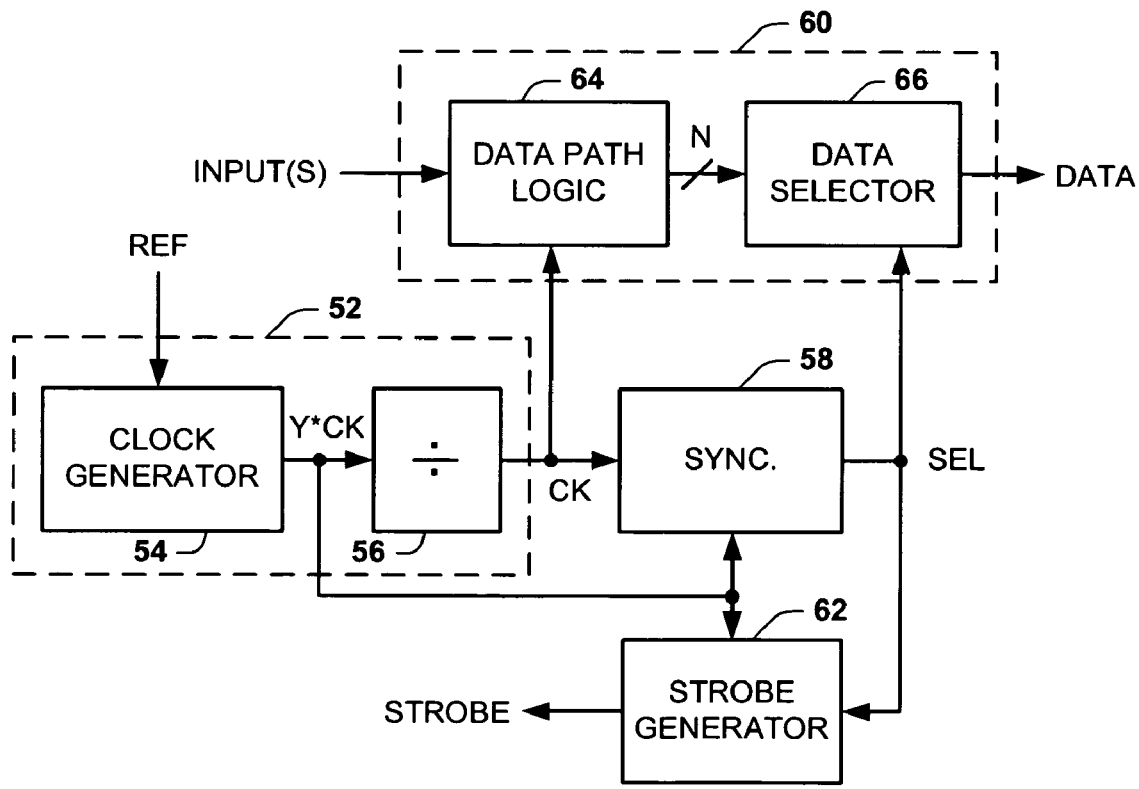
FIG. 2 depicts an example of a block diagram for implementing a strobe-based timing strategy.

FIG. 2 depicts an example of a system 50 for providing DATA that is synchronized with a STROBE signal. The system 50 includes a clock generation system 52 that is operative to provide a pair of clock signals indicated at CK and Y*CK, where Y is multiplier denoting the frequency relationship between the respective signals. The clock generation system 52 includes a clock generator 54 that is operative to provide the Y*CK signal at a desired frequency and duty cycle (e.g., 50%). For example, the clock generator 54 can be implemented as a PLL or DLL network configured to provide the Y*CK signal at a desired frequency based on the reference clock signal (REF). The clock generator 54 also provides the Y*CK signal to a frequency divider 56. The frequency divider 56 is operative to provide the CK signal with a fractional frequency relative to the Y*CK signal (i.e., the frequency of CK is 1/Y the frequency of Y*CK). For example, the clock generation system 52 can provide the CK signal at one-half the frequency of the Y*CK signal (i.e., Y=2).

The clock generation system 52 provides the CK signal to a synchronization component 58 that is operative to provide a selection signal SEL based on the CK and Y*CK signals. The synchronization component 58, for example, can be implemented as a register, latch or flip flop that is operative to propagate the CK signal based on the Y*CK signal. By providing the SEL signal based on the Y*CK signal, which has a greater frequency than the CK input signal, the SEL signal can be shifted a desired amount relative to the CK signal. The synchronization component 58 provides the SEL signal to a data path 60 as well as to a strobe generator 62. The CK signal also is provided to the data path 60 to facilitate propagating input data to a desired destination.

In this example, the data path 60 includes data path logic 64 that receives the input data as one or more inputs, which can be fed to one or more corresponding inputs of the data path. Any available data source can provide the input data to the data path 60, such as at one or more corresponding inputs, via a system bus. The data path logic 64 is configured to provide N inputs to the data selector, where N is an integer corresponding to the number of bits of input data provided by the data source (N≧1). The data path logic 64 provides a corresponding output comprising the input data to a data selector 66, such as arranged in a parallel format by the data path logic. The data selector 66 is operative to propagate the N bits of data as output DATA based on the SEL signal provided by the synchronization component 58. For example, the data selector 66 is operative to propagate each of the N inputs based on the SEL signal into a serial data stream comprising the DATA.

The strobe generator 62 is operative to provide the STROBE signal based on the SEL signal and the Y*CK signal. The strobe generator 62 thus includes circuitry (e.g., arrangement of logic and driver circuitry) that employs the SEL signal to provide the STROBE signal at the same frequency as the SEL signal, but shifted a desired amount based on the Y*CK signal. The amount of shifting can be the same or different from that imposed on the CK signal by the synchronization component 58, which is also based on the Y*CK signal.

Because the synchronization component 58 and strobe generator can both be clocked based on the Y*CK signal, which is at a greater frequency that the CK signal, the STROBE signal can be provided at the same frequency as the DATA signal, but phase shifted by a desired amount. The amount of phase shift can vary according to the frequencies of the clock signals CK and Y*CK provided by the clock generation system 52, and based on the particular type of logic implemented as the synchronization component 58 and strobe generator. For example, by implementing Y=2 (e.g., Y*CK is at twice the frequency of CK), a corresponding quarter cycle shift between the DATA and STROBE signals can be realized. Timing margins in the signals can be improved further by implementing the strobe generator 62 to include additional circuitry (e.g., a data selector) corresponding to the data selector 66.

Figure 3:
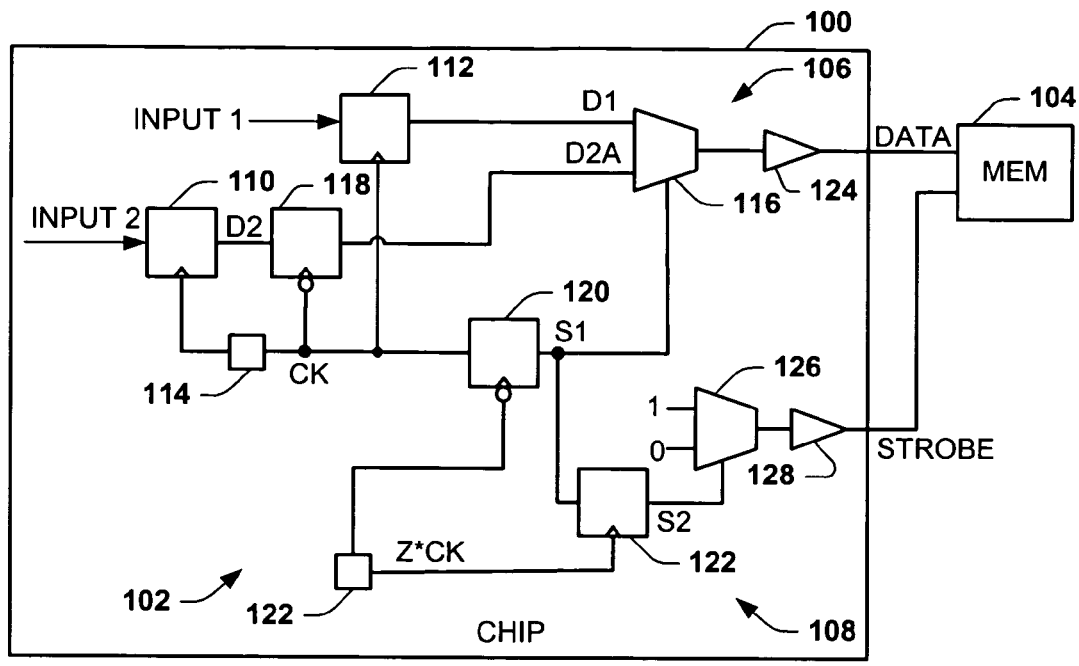
FIG. 3 depicts an example of a system for implementing a strobe-based timing strategy.

FIG. 3 depicts an example of an integrated circuit chip 100 implementing a synchronization system 102. For example, integrated circuit 100 can be implemented as a memory controller for use in communicating data to or from an associated memory 104. The memory 104 can include one or more memory modules, such as RAM. For instance, the memory 104 can include one or more DRAM modules (e.g., DDR SDRAM), such as JEDEC compliant memory modules (e.g. DDR or DDR II memory).

The synchronization system 102 includes a data path portion 106 and a strobe generation portion 108. The data path portion 106 includes a pair of registers 110 and 112 that receive corresponding input signals INPUT1 and INPUT2 signals. For example, the INPUT1 and INPUT2 signals can be provided as two-bit data from an associated source, which has been de-multiplexed into separate data paths. A data source can include a CPU or other computing device that provides input data via a corresponding system bus.

A clock signal CK having a desired frequency is provided at an internal node 114 of the system 102. The CK signal, for example, corresponds to a core clock signal having a desired frequency (e.g., 200–300 MHz) for propagating data through the chip 100. The particular frequency can vary according to the implementation and specification requirements. The CK signal is provided to the registers 110 and 112 for clocking the data contained in the INPUT1 and INPUT2 signals respectively through the registers.

The register 112 provides an output signal (e.g., one or more bits), indicated at D1, to an input of a multiplexer 116 according to the CK signal. The register 110 provides an output signal (e.g., one or more bits) D2 to another register 118 corresponding to the INPUT2 signal. The register 118 propagates the D2 signal to another input of the multiplexer 110 as data D2A. In the example of FIG. 3, the register 118 operates to gate D2 to the multiplexer 116 on the negative (or falling) edge of the CK signal. Because, in this example, the CK signal is provided to an inverting clock input of the register 118, D2A corresponds to D2 approximately 180 degrees out of phase with D1.

The CK signal also is provided to an input of another register 120. The register 120 provides a multiplexer selection signal (S1) to the multiplexer 116 based on another clock signal indicated at Z*CK, where Z denotes a frequency multiplier corresponding to the relationship between frequencies of the CK and Z*CK clock signals (e.g., Z>1). The Z*CK signal is provided at an internal node 122 of the chip 100. Z can be fixed or programmable, for example. The clock signal Z*CK is provided at a desired frequency that is a proportional multiple of the CK signal corresponding to the multiplier Z (e.g., 400–600 MHz). Since the register 120 provides the S1 signal based on the negative edge of the Z*CK signal, the S1 signal can be provided with a desired amount of phase shift relative to the CK signal. The register 120 thus operates as synchronization logic that propagates the CK signal as the S1 signal to each of the data path portion 106 and the strobe generation portion 108.

By way of example, the respective clock signals CK and Z*CK can be provided by clock generation circuitry (e.g., PLL or DLL circuitry), which may be located internal or external relative to the chip 100. Alternatively separate clock generation circuitry can be utilized to generate the respective signals. However, it will be appreciated that by generating the CK and Z*CK signals from a single clock generator, reduced clock skew and improved timing margins can be achieved in the system 102.

The multiplexer 116 selectively provides an output signal to a buffer/driver 124 based on the S1 signal. The output signal corresponds to D1 or D2A depending on the S1 signal. The buffer/driver 124, in turn, provides the DATA signal to the memory 104. The DATA signal thus corresponds to a serial stream comprising the data D1 and D2A based on the operation of the multiplexer 116 according to the S1 signal.

The S1 signal and the Z*CK clock signal also are provided to the strobe generation portion 108. In the example of FIG. 3, the strobe portion 108 includes a register 122 that propagates the S1 signal based on the Z*CK signal. The register 122 thus provides a multiplexer selection signal S2 to an associated multiplexer 126. The multiplexer 126 receives as its inputs a high and low signal, indicated as 1 and 0, respectively. The multiplexer 126 provides a corresponding output signal (e.g., a 1 or a 0) based on the S2 signal provided by the register 122. The register 122 operates to propagate the S1 signal as the S2 signal to the multiplexer based on an edge that is different from the clock edge employed by the register 120 to provide the S1 signal. For instance, the register 122 can utilize a positive (or rising) edge of the Z*CK signal to provide the S2 signal, such that its output signal is phase shifted a desired amount relative to the S1 signal, having been provided at the negative edge of Z*CK. The multiplexer 126 provides a corresponding output signal to a buffer/driver 128, which, in turn, provides the STROBE outputs signal to the memory 104. As a result, the system 100 can synchronously provide the DATA and STROBE signals to the memory.

Figure 4:
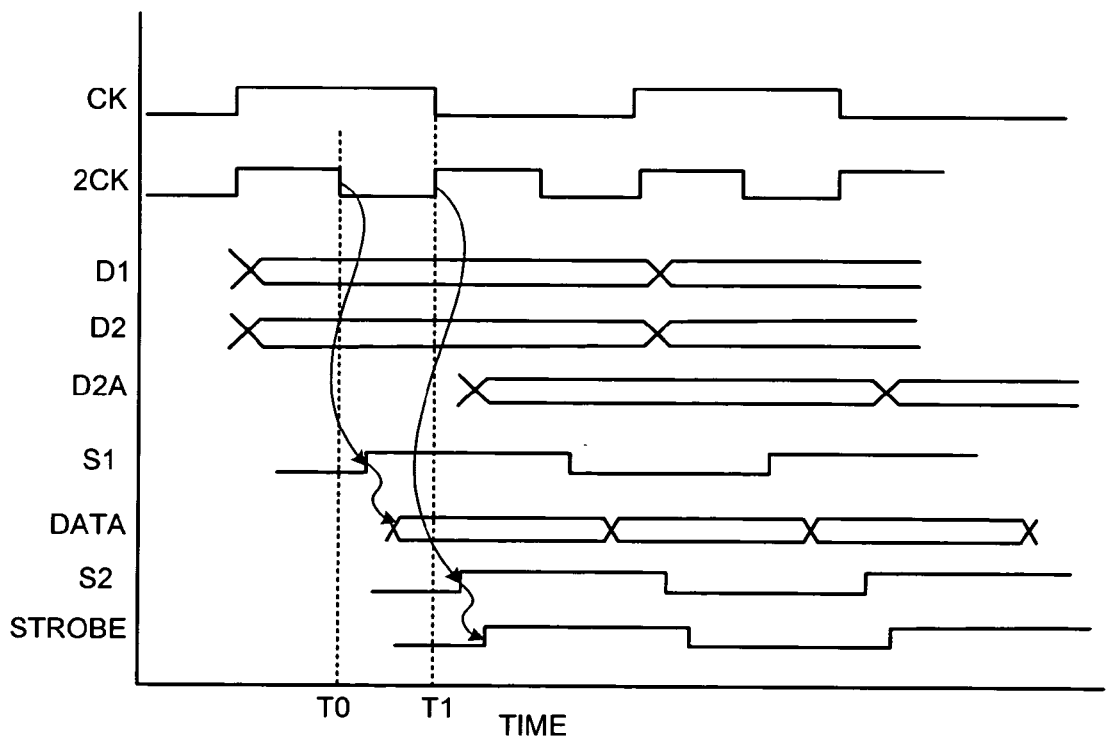
FIG. 4 depicts a timing diagram associated with the system of FIG. 3.

The operation of the synchronization system 102 will be better appreciated with reference to FIG. 4. FIG. 4 illustrates a timing diagram for various signals that can be provided by the synchronization system 102 of FIG. 3. In the example of FIG. 4 it is assumed that Z=2, such that the Z*CK signal has a frequency that is twice the frequency of the CK signal (i.e., Z*CK it is a double speed version of CK). As described herein, other frequency relationships between the respective signals also can be utilized.

Referring between FIGS. 3 and 4, it is shown that the register 120 propagates the CK signal based on the negative or falling edge of the Z*CK signal (indicated at time T0) to provide the S1 signal. The S1 signal thus is delayed approximately a quarter of a cycle (or a signal period) relative to the CK signal. Accordingly, the data multiplexer 116 is clocked off the falling edge of Z*CK (e.g., based on the S1 signal), and the strobe multiplexer 126 is clocked off the rising edge of the Z*CK signal (e.g., based on the S2 signal). This enables a desired phase shift between the STROBE signal and the DATA signal. Additionally, this causes the multiplexer select signal S1 to be substantially centered in its data window. That is, when the S1 signal is high it is substantially centered relative to D1, and when S1 is low, it is substantially centered to D2A. This provides approximately one-quarter cycle of stable data for setup and hold. This also substantially eliminates the need for reset circuitry to clear or preset the multiplexer selection input for the multiplexer 116. It will be appreciated that, in the absence of such an arrangement, difficulty might exist for presetting or clearing the S1 signal according to the relationships of the clock signal CK and Z*CK.

As mentioned above, the S1 signal cascades to the strobe path logic so that the resulting STROBE signal has a desired phase relationship and frequency (e.g., it is synchronized) relative to the DATA signal provided by the data path portion 106. The register 122 propagates the S1 signal based on the positive or rising edge of the Z*CK signal (indicated at time T0) to provide the S2 signal. Since the multiplexer select signal S2 for the multiplexer 126 is clocked off the rising edge of the Z*CK signal, the multiplexer 126 provide a corresponding output signal to the buffer/driver 126, which signal is synchronized with the signal provided by the data path multiplexer 116. Additionally, the multiplexer 126 in the strobe path and the multiplexer 116 in the data path portion 106 the strobe path can be substantially equalized (e.g., matched circuitry) to improve the timing margin.

It is to be further appreciated that in the approach depicted in FIG. 3, duty cycle may be a factor in inner loop timing only, since the data is clocked out at the negative edge of Z*CK and the strobe signal is clocked out on the positive edge of the Z*CK signal. Since, in this example, the STROBE signal is only clocked out on the positive edges of Z*CK, duty cycle need not be considered in outer loop timing. This is to be contrasted with conventional approaches that normally copy the core clock signal for use as the strobe signal. Such conventional approaches generally need to account for duty cycle distortion of the clock signal in both the inner loop and the outer loop timing strategies.

Figure 5:
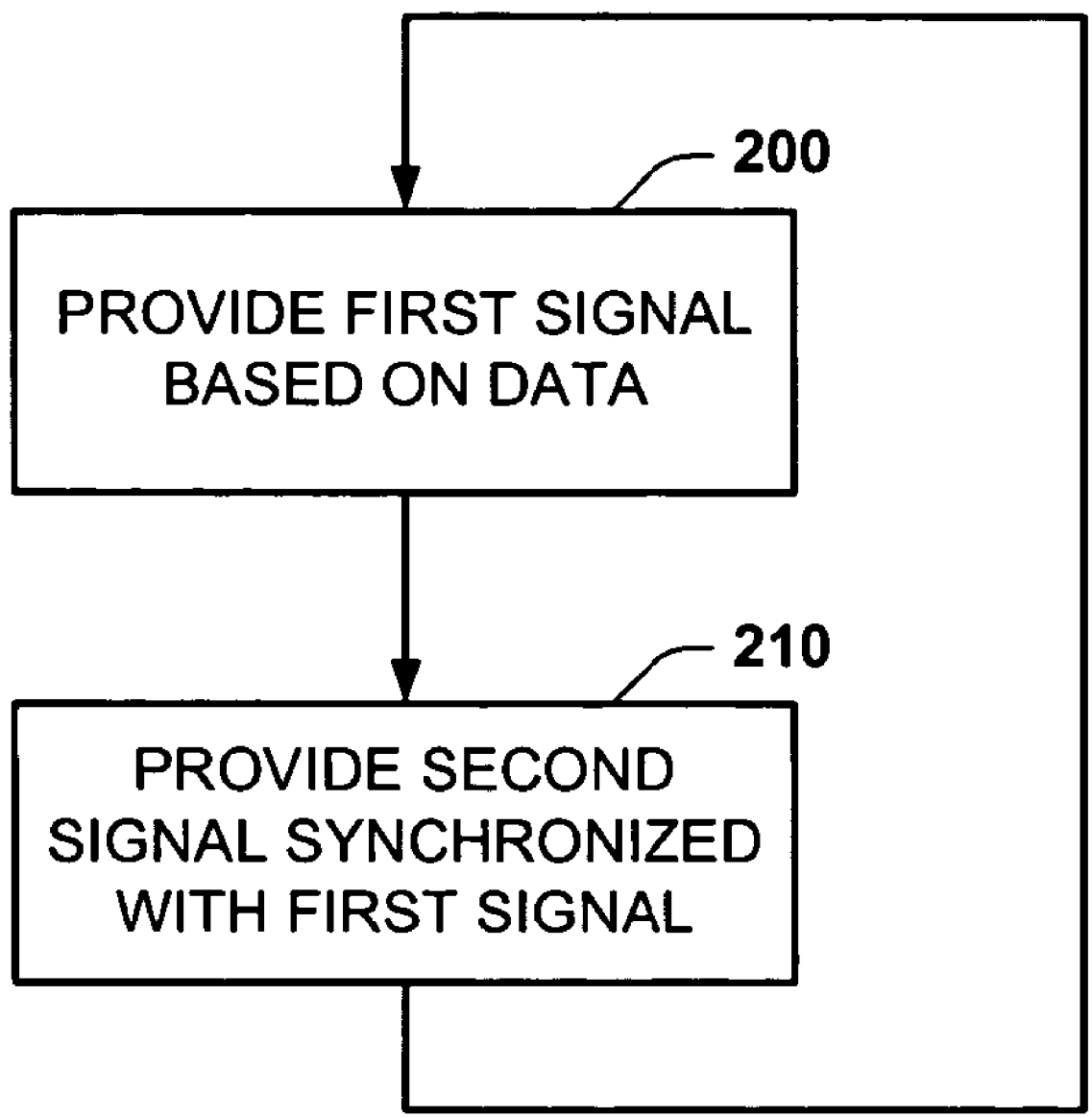
FIG. 5 is a flow diagram illustrating a method for implementing a timing strategy.
Figure 6:
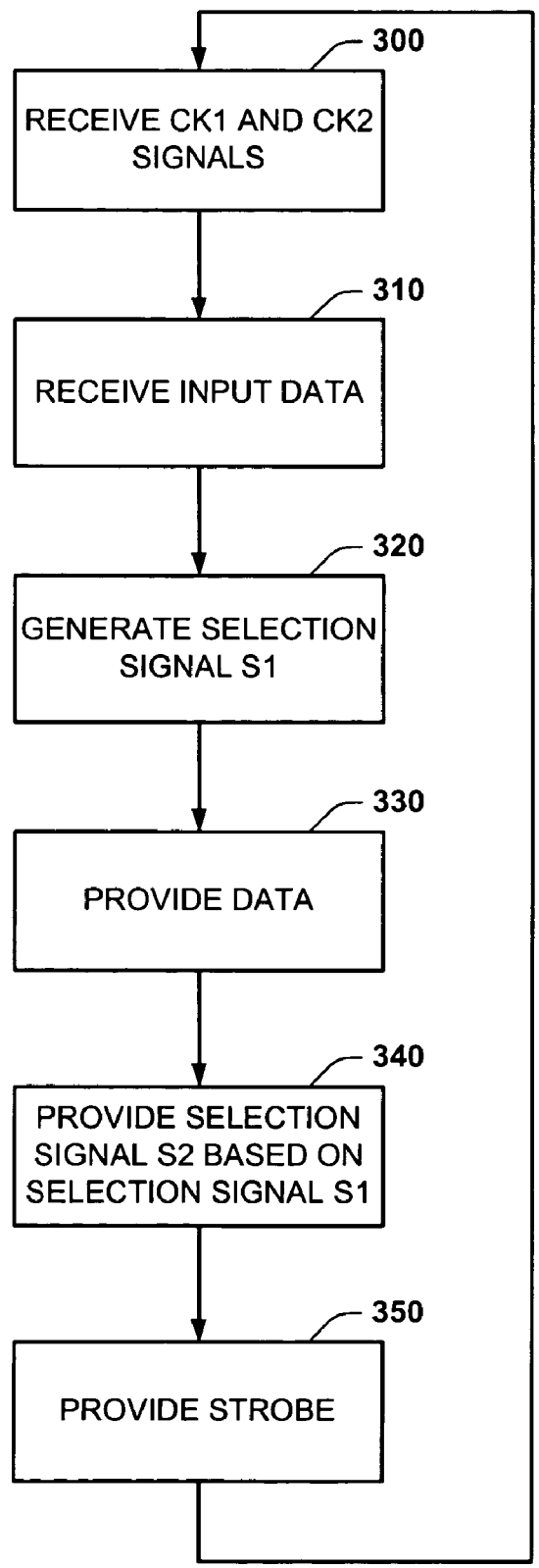
FIG. 6 is a flow diagram illustrating another method for implementing a timing strategy.

In view of the foregoing structural and functional features described above, certain methodologies that can be implemented will be better appreciated with reference to FIGS. 5 and 6. While, for purposes of simplicity of explanation, the methodologies of FIGS. 5 and 6 are shown and described as being implemented serially, it is to be understood and appreciated that the illustrated actions, in other embodiments, may occur in different orders and/or concurrently with other actions. Moreover, not all illustrated features may be required to implement a method.

It is to be further understood that the following methodology can be implemented in hardware, such as one or more integrated circuits, software, or any combination thereof. For example, in one embodiment, a method can be implemented as logical actions performed by circuit components (digital and/or logical components) arranged to implement a desired method.

FIG. 5 depicts a method that includes providing a first signal based on input data, as shown at 200. The first signal has a desired frequency corresponding to a first clock signal. At 210, a second signal is provided that is synchronized with the first signal by employing a second clock signal having a frequency that is a multiple of the desired frequency.

FIG. 6 depicts an example of a method for synchronously providing a data signal with a strobe signal. The method begins at 300 in which a first and second clock signals (CK1 and CK2) are received. The clock signals can be generated internally within an IC chip or other system (e.g., a memory controller) implementing the method. Alternatively, one or both of the clock signals can be generated externally; although, clock skew between the first and second clock signals can be reduced by providing such signals from a single source. In this example, the second clock signal (CK2) has a greater frequency than the first clock signal (CK1). For instance, the frequency of the second clock signal (CK2) can be twice that of the first clock signal (CK1). It is to be appreciated that different proportional relationships between the relative frequencies of the clock signal also could be implemented.

At 310, input data is received. The input data can be received from any source (e.g., a CPU) that aspires to transmit data to a corresponding destination. The input data can be provided as single or multi-bit data, depending generally on the implementation. A selection signal (S1) is generated at 320. The selection signal (S1) can be generated by propagating the first clock signal through a circuit component based on the faster second clock signal (CK2). For the example where the second clock signal (CK2) is at twice the frequency as the first clock signal (CK1), the selection signal (S1) can be provided at the same frequency and with a quarter cycle shift relative to the first clock signal (CK1). This result can be achieved, for example, by using a negative edge of the second clock signal (CK2) to propagate the first clock signal (CK1).

At 330, the selection signal (S1) can be employed to provide the input data as output data having a desired frequency and phase characteristics. For example, the selection signal (S1) can be provided as a control input to a multiplexer or other selection device capable of selectively providing the output data signal (at 330) based on the selection signal (S1).

At 340, the selection signal is shifted a desired amount to provide another selections signal (S2). The second selection signal (S2) can be generated, for example, by propagating the first selection signal (S1) through circuitry based on an edge of the second clock signal (CK2) that is different from the edge employed to provide the first selection signal (S1) at 320. Continuing with the above example where the second clock signal (CK2) is at twice the frequency as the first clock signal (CK1), the second selection signal (S2) can be provided at the same frequency and with a quarter cycle shift relative to the first selection signal (S1). This relationship can be achieved by propagating the first selection signal through such circuitry using a positive edge of the second clock signal (CK2), where a negative edge of CK2 is used to provide the first selection signal (S1).

At 350, the strobe signal can be provided based on the second selection signal (S2). From 350, the method can return to 300 and repeat for the next cycle for synchronously providing data and strobe signals. It is to be appreciated that the strobe signal has desired frequency and deterministic phase characteristics relative to the data signal. The method enables the strobe to be provided synchronously with the data signal so as to mitigate duty cycle jitter and distortion. As a result, the overall timing margin can be significantly improved.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system comprising:
   a data path that provides a data signal at a first frequency corresponding to a first clock signal;
   a strobe generator that generates a strobe signal at the first frequency, the strobe signal being synchronized with the data signal based on a second clock signal having a second frequency that is different from the first frequency; and
   a synchronization component that provides a synchronization signal to the data path and to the strobe generator based on the first and second clock signals.

2. The system of claim 1, wherein the synchronization component propagates the first clock signal to define the synchronization signal provided to the data path and to the strobe generator, such that the synchronization signal has a desired phase shift relative to the first clock signal.

3. The system of claim 2, wherein the synchronization component provides the synchronization signal based on one of a rising edge and a falling edge of the second clock signal.

4. The system of claim 3, wherein the strobe generator provides the strobe signal based on the other of the rising edge and the falling edge of the second clock signal so tat the strobe signal is shifted a desired amount relative to the data signal.

5. The system of claim 1, wherein the data path further comprises a data selector that selectively propagates input data to define the data signal based on the synchronization signal.

6. The system of claim 5, wherein the data path further comprises data path logic that receives at least one input signal and provides the input data to the data selector.

7. The system of claim 5, wherein the strobe generator further comprises a selector component that selectively provides logic values to define the strobe signal based on a phase shifted version of the synchronization signal.

8. The system of claim 7, wherein the strobe generator implements a phase shift on the synchronization signal based on the second clock signal to provide the phase shifted version of the synchronization signal to the selector component of the strobe generator.

9. The system of claim 7, wherein the data selector comprises a multiplexer for selectively providing the data signal using the synchronization signal as a selection input signal, and the selector component of the strobe generator comprises a multiplexer for selectively providing the strobe signal using the phase shifted version of the synchronization signal as a selection input signal.

10. The system of claim 1, wherein the second frequency is an integer multiple of the first frequency, such that the strobe signal is delayed approximately a desired fraction of a cycle of a period relative to the data signal corresponding to a predetermined amount of phase shift between the strobe signal and the data signal.

11. The system of claim 10, wherein the second frequency is approximately twice the first frequency, such that the strobe signal is delayed approximately a quarter of a cycle relative to the data signal.

12. A memory controller comprising the system of claim 1, the memory controller employs the system to at least one of read and write data tat defines the data signal to associated memory.

13. An integrated circuit comprising the system of claim 1.

14. A system comprising:
a synchronization component that provides a synchronization signal by propagating a first clock signal to define the synchronization signal based on a second clock signal, the second clock signal having a different frequency from a frequency of the first clock signal;
a data path that provides a data signal at the frequency of the first clock signal; and
a strobe generator that generates a strobe signal synchronized with the data signal based on the synchronization signal and the second clock signal.

15. The system of claim 14, wherein the synchronization component provides the synchronization signal with a desired phase shift relative to the first clock signal.

16. The system of claim 14, wherein the synchronization component provides the synchronization signal based on one of a rising edge and a falling edge of the second clock signal.

17. The system of claim 16, wherein the strobe generator provides the strobe signal based on the other of the rising edge and the falling edge of to second clock signal so that the strobe signal is phase shifted a desired amount relative to the data signal.

18. The system of claim 17, wherein the strobe signal is phase shifted approximately a quarter of a cycle relative to the data signal.

19. The system of claim 16, wherein the data path further comprises a data selector that selectively propagates input data received from an associated data source as the data signal based on the synchronization signal.

20. The system of claim 19, wherein the data path further comprises data path logic that receives at least one input signal corresponding to the input data and provides the input data to the data selector.

21. The system of claim 19, wherein the strobe generator further comprises a selector component that selectively provides logic values as the strobe signal based on a phase shifted version of the synchronization signal.

22. The system of claim 21, wherein the strobe generator implements a phase shift on the synchronization signal based on the second clock signal to provide the phase shifted version of the synchronization signal to the selector component of the strobe generator.

23. The system of claim 21, wherein the data selector and the selector component of the strobe generator comprise substantially matched circuitry to provide a desired timing margin.

24. The system of claim 14, wherein the frequency of the second clock signal is approximately twice the frequency of the first clock signal, such that the strobe signal is delayed approximately a quarter of a cycle relative to the data signal.

25. A memory controller comprising the system of claim 14, the memory controller employs the system to at least one of read and write data as the data signal to associated memory.

26. A synchronous dining system comprising:
means for providing a data signal at a first frequency by propagating associated data based at least in part on a first clock signal having the first frequency;
means for providing a strobe signal at the first frequency synchronously with the data signal based on a second clock signal having a second frequency that is different from the first frequency; and
means for providing a synchronization signal based on the first and second clock signals, the means for providing the data signal and the means for providing the strobe signal providing respective signals based on the synchronization signal.

27. The system of claim 26, further comprising means for selecting a data input to provide as the data signal based on the synchronization signal.

28. The system of claim 27, further comprising means for selecting an output level to provide as the strobe signal based on a phase shifted version of the synchronization signal.

29. The system of claim 26, further comprising means for providing the first and second clock signals.

30. The system of claim 26, wherein the means for providing the synchronization signal further comprises means for phase shifting the first clock signal based on the second clock signal.

31. The system of claim 30, further comprising means for phase shifting the synchronization signal based on the second clock signal, the strobe signal being at a selected level based on the phase shifted synchronization signal.

32. A method comprising:
providing a first signal based on input data, the first signal having a desired frequency corresponding to a first clock signal;
providing a second signal that is synchronized with the first signal by employing a second clock signal having a frequency that is a multiple of the desired frequency;
phase shifting the first clock signal based on the second clock signal to provide a selection signal, the first signal and the second signal being synchronized relative to each other based on the selection signal.

33. The method of claim 32, further comprising phase shifting the selection signal based on the second clock signal, the second signal being provided based on the phase shifted selection signal.

34. The method of claim 32, wherein the second signal is phase shifted relative to first signal based on the respective frequencies of the first and second clock signals.

35. The method of claim 34, wherein the second signal is phase shifted approximately a quarter of a cycle relative to first signal.

* * * * *

UNITED STATES PATENT AND TRADEMARK OFFICE
CERTIFICATE OF CORRECTION

PATENT NO.       : 7,178,048 B2                                    Page 1 of 1
APPLICATION NO.  : 10/744174
DATED            : February 13, 2007
INVENTOR(S)      : Victoria Lo-Ren Smith et al.

It is certified that error appears in the above-identified patent and that said Letters Patent is hereby corrected as shown below:

In column 8, line 51, in Claim 4, delete "tat" and insert -- that --, therefor.

In column 9, line 22, in Claim 12, delete "tat" and insert -- that --, therefor.

In column 9, line 44, in Claim 17, delete "to" and insert -- the --, therefor.

In column 10, line 15, in Claim 26, delete "dining" and insert -- timing --, therefor.

In column 10, line 49, in Claim 32, after "desired frequency;" insert -- and --.

Signed and Sealed this

Eleventh Day of November, 2008

JON W. DUDAS
*Director of the United States Patent and Trademark Office*

UNITED STATES PATENT AND TRADEMARK OFFICE
CERTIFICATE OF CORRECTION

PATENT NO.         : 7,178,048 B2                                                        Page 1 of 1
APPLICATION NO. : 10/744174
DATED                  : February 13, 2007
INVENTOR(S)        : Victoria Lo-Ren Smith et al.

It is certified that error appears in the above-identified patent and that said Letters Patent is hereby corrected as shown below:

In column 8, line 51, in Claim 4, delete "tat" and insert -- that --, therefor.

In column 9, line 22, in Claim 12, delete "tat" and insert -- that --, therefor.

In column 9, line 44, in Claim 17, delete "to" and insert -- the --, therefor.

In column 10, line 15, in Claim 26, delete "dining" and insert -- timing --, therefor.

In column 10, line 49, in Claim 32, after "desired frequency;" insert -- and --.

Signed and Sealed this

Second Day of December, 2008

JON W. DUDAS
*Director of the United States Patent and Trademark Office*